United States Patent [19]

Arnett et al.

[11] Patent Number: 5,049,461

[45] Date of Patent: Sep. 17, 1991

[54] METHOD OF MAKING AND USING A HIGH RESOLUTION LITHOGRAPHIC MASK

[75] Inventors: Patrick C. Arnett, Morgan Hill, Calif.; Andres Bryant, Essex Junction, Vt.; John S. Foster; Jane E. Frommer, both of Morgan Hill, Calif.; Jon A. C. Iwata, Los Gatos, Calif.

[73] Assignee: International Business Machines Corporation, Armonk, N.Y.

[21] Appl. No.: 367,815

[22] Filed: Jun. 19, 1989

[51] Int. Cl.⁵ .............................................. G03F 9/00
[52] U.S. Cl. ...................................... 430/5; 430/296; 430/942; 250/492.1
[58] Field of Search ................... 430/5, 296, 325, 329, 430/331, 396, 942; 365/113, 151; 427/43.1, 77; 250/492.1

[56] References Cited

U.S. PATENT DOCUMENTS

| | | | |
|---|---|---|---|
| 4,601,971 | 7/1986 | Lischke | 430/296 |
| 4,802,951 | 2/1989 | Clark et al. | 156/630 |
| 4,916,688 | 4/1990 | Foster et al. | 369/126 |

OTHER PUBLICATIONS

M. A. McCord et al., "Lithography with the Scanning Tunneling Microscope", *J. Vac. Sci. Tech.*, B4, 86 (1986), pp. 86–88.

Ringger et al., "Nanometer Lithography with the Scanning Tunneling Microscope", *Appl. Phys. Lett.*, 46, pp. 832–834 (1985).

R. Hrach, "Modelling of Electron Emission from Sandwich Cathodes", *Vacuum*, vol. 31, No. 7, p. 297 (1981).

S. K. Bahl et al., "Amorphous vs. Crystalline GeTe Films", *Journal Appl. Physics*, vol. 41, No. 5, pp. 2196–2212 (1970).

Primary Examiner—Charles L. Bowers, Jr.
Assistant Examiner—Kathleen Duda
Attorney, Agent, or Firm—Henry E. Otto, Jr.

[57] ABSTRACT

A high resolution lithographic mask having a desired pattern is generated and used to replicate the pattern onto a film in a one-step process.

A film of phase-changeable material in one state is provided on a conductive substrate. By scanning tunneling microscope techniques, the state and thereby the conductivity or other property of the material in selected areas of the film is changed to a second state to provide from the film a mask having a desired pattern defined by crystalline areas. Amorphous material need not be removed from the mask.

To replicate the pattern on another film, the latter is placed on another conductive substrate; the mask is positioned with its patterned side within electron tunneling distance of said other film; and the pattern is replicated in a single step by applying a voltage between the mask and other film. The voltage charge on said mask is positive and negative on said other film to cause current to flow in the crystalline areas of said mask and, by electron flow from said film to the mask, eliminate backscattering and insure high resolution.

As the state changes (e.g., from crystalline to amorphous) in the pattern areas of said other film, conductivity in the crystalline areas will progressively decrease and, by causing a corresponding reduction in current flow in the crystalline areas, minimize the risk of undesired broadening of exposed areas of said other film.

14 Claims, 2 Drawing Sheets

METHOD OF MAKING AND USING A HIGH RESOLUTION LITHOGRAPHIC MASK

TECHNICAL FIELD

This invention relates to high resolution lithographic masks, and more particularly to a method of making such a mask using tunneling microscopy technology and using the mask so made.

BACKGROUND OF THE INVENTION

To effect further significant increases in the density of semiconductor chips, the circuit lines interconnecting the various devices on the chips must be made significantly finer. This requires use of lithographic masks having extremely high resolution, such as of the order of tens of angstroms.

Resist patterning by scanning tunneling microscope (STM) techniques and fabricating patterned cathodes for direct exposure of electron resists has heretofore been proposed. For example, J. Vac. Sci. Tech. B4,86 (1986) describes exposure of PMMA with a tunneling microscope operating in field-emission and formation of lines of about 1000 angstroms. This is an exceedingly slow process because electron emission is only from a single tip which covers a small area. A somewhat related experiment published in Appl. Phys. Lett. 46, pp. 832-834 (1985) reports producing a periodic structure with 160 angstroms wavelength with a scanning tunneling microscope (STM).

U.S. Pat. No. 4,601,971 describes a mask for use in producing structures by electron lithography based on a tunnel junction cathode. Electrons tunneling through the metal-insulator thin metal junction of the cathode pass through the nearly transparent outer metal layer to expose the electron resist. The cathode is patterned in two ways: (1) by varying the thickness of the insulator in the tunnel junction; and since areas with a thick insulator conduct much less current, the resist is not exposed in those areas; or (2) by providing a constant tunnel junction insulator, but adding an electron absorber in those areas that are not to be exposed. This patented technique is projection lithography in which a potential is applied across the two electrodes of the cathode and electrons are launched toward the substrate. This undesirably leads to an angular dispersion of electrons, however, as described in Vacuum, Vol. 31, No. 7, p. 297 (1981) and, therefore, a loss of resolution. Moreover, the cathode is fabricated by conventional thin film techniques and could not achieve the high resolution now desired. Also, the voltage and current density are limited by breakdown of the insulator in the tunnel junction structure. For this reason, tunnel junctions are extremely difficult to operate at room temperature, creating an important technological problem.

U.S. Pat. No. 4,802,951 proposes a method for array fabrication of nanometer scale structures. The method relies on the self-assembling of molecules into an ordered array. The variation in properties of the molecule, such as, thickness, density, etc., are exploited to define repetitive patterns in the underlying film or on the supporting substrate. The limitation of this technique is that the patterns are not arbitrary. They are repetitive in nature and limited to the properties of suitable molecules.

The copending application, U.S. Ser. No. 07/175,835, filed Mar. 31, 1988, now U.S. Pat. No. 4,916,688 and assigned to the assignee of the present invention, discloses use of STM techniques to change the state of a phase-changeable material in selected areas to record data bits on a data storage device, and use of STM techniques to sense or change the state of the data bits. However, said application does not disclose or suggest use of a changeable material to create a desired pattern on a lithographic mask and use of such a mask for replicating the pattern.

SUMMARY OF THE INVENTION

According to the invention, a method and means are provided for generating a high resolution lithographic mask having a desired pattern and using the mask thus generated to replicate the pattern onto a film in a one-step process.

As illustrated, a film of phase-changeable material having a region uniformly in a first (preferably amorphous) state is provided on a conductive substrate. The electrode emitting tunneling tip of a scanning tunneling microscope is moved in a z direction to within electron tunneling distance from said region. Thereafter, voltage pulses are applied to said tip in a preselected sequence while concurrently effecting relative movement between the tip and film in preselected x and y directions to change the phase and thereby the conductivity of the material in selected areas of said region to a second (preferably crystalline) state to provide from the film a mask having the desired pattern defined by the crystalline areas. The amorphous material need not be removed from the mask.

Another film on which the pattern is to be replicated is then placed on another conductive substrate, and the mask is positioned with its patterned side within electron tunneling distance of said other film. The pattern is replicated on said other film in a single step by applying a voltage between said mask and other film. The voltage charge on said mask is positive and negative on said other film to cause current to flow in the crystalline areas of said mask and, by electron flow from said film to the mask, eliminate backscattering and insure high resolution.

During replication, as the state changes from crystalline to amorphous in the pattern areas of said other film, conductivity in the crystalline areas will progressively decrease and, by causing a corresponding reduction in current flow in the crystalline areas, minimize the risk of undesired broadening of exposed areas of said other film.

DESCRIPTION OF THE PREFERRED EMBODIMENTS

GENERATING THE MASK

Figure 1A:
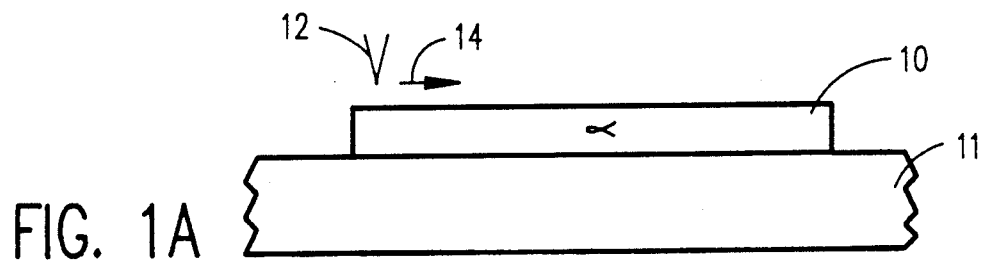
FIG. 1A is a side elevational view, to exaggerated scale, of a film of phase change material on a conducting substrate, and schematically depicting an STM-type stylus tip disposed in operative relationship thereto before patterning.

As illustrated in FIG. 1A, a thin film 10 of a phase change material is provided on a conductive substrate 11, such as of Si. Film 10 is preferably of GeTe or α-Si or other semiconductor material having a thickness of about 200 to 2000 angstroms and a crystalline state and an amorphous state. Disposed within tunneling distance, shorter than 2 nm, from the surface of film 10 is an electron-emitting tip 12 of a scanning tunneling microscope (STM).

The manner and structure by which the substrate 11 and film 10 are supported and tip 12 is brought in the z direction to within the tunneling distance and then moved in x-y directions relative to the surface of the film while concurrently maintaining the tip within said tunneling distance forms no part of the present invention. The apparatus for effecting and controlling such movements may, for sake of illustration, be as described in U.S. Pat. No. 4,668,865, assigned to the assignee of the present invention, and incorporated herein by reference.

A small DC bias voltage of about 0.7 volts is maintained between tip 12 and substrate 11 to keep the tip within tunneling distance of the substrate. Tip 12 is moved in x,y directions within the tunneling distance of film 10 to create a desired pattern on the film and thereby create a lithographic mask in the following manner.

Figure 1B:
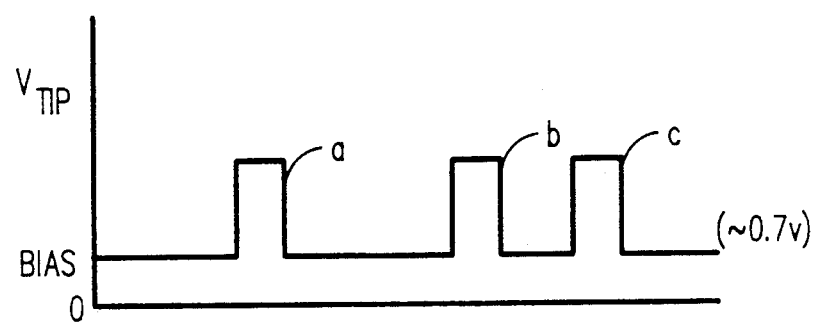
FIG. 1B is a plot of the voltage applied to the tip versus time to create a desired mask pattern.

As illustrated in FIG. 1A, film 10 initially is uniformly in its amorphous state. As tip 12 is moved in the desired x,y direction (e.g., see arrow 14), voltage pulses a,b,c (FIG. 1B) of about 5-50 volts and 200-500 nanoseconds duration, depending upon the thickness of film 10, are applied successively between the tip and film. These pulses locally heat the film while the tip is disposed above areas a',b',c', respectively, (FIG. 1C) of the film.

The localized temperatures generated (e.g., about 400°C.) by the successive voltage pulses a,b,c will have been sufficient to change the state of the film in areas a',b',c' to crystalline, thereby changing the electrical conductivity of the film in these areas. Journ. Appl. Physics 41, pp. 2196-2212 (1970) confirms that conductivity of the crystalline areas of the GeTe film is as much as six orders of magnitude higher than in the amorphous areas. The phase state can be changed in areas as small as 50 angstroms by use of the STM tip 12. The mask 15 can now desirably be used without requiring removal of the amorphous areas surrounding the crystallized patterned areas a',b',c'.

Using the Mask

Figure 1C:
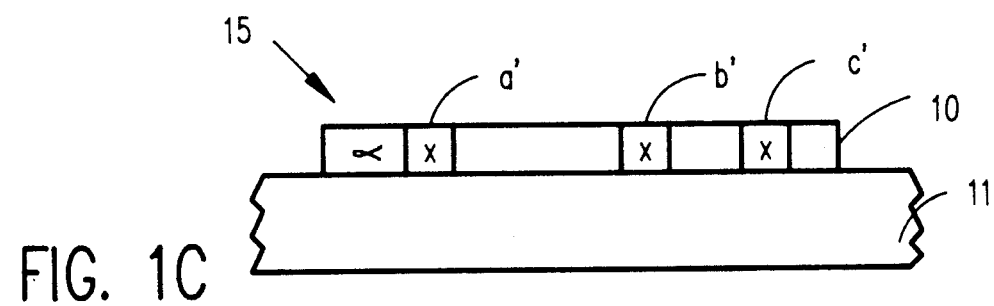
FIG. 1C is a side elevational view of a mask created from the material of FIG. 1A by patterning with the STM tip.

The mask 15 thus created and illustrated in FIG. 1C can now be used to replicate the pattern in a single step on a series of other thin films, such as a film 16 (FIG. 2A) on a wafer, in the following manner.

Figure 2A:
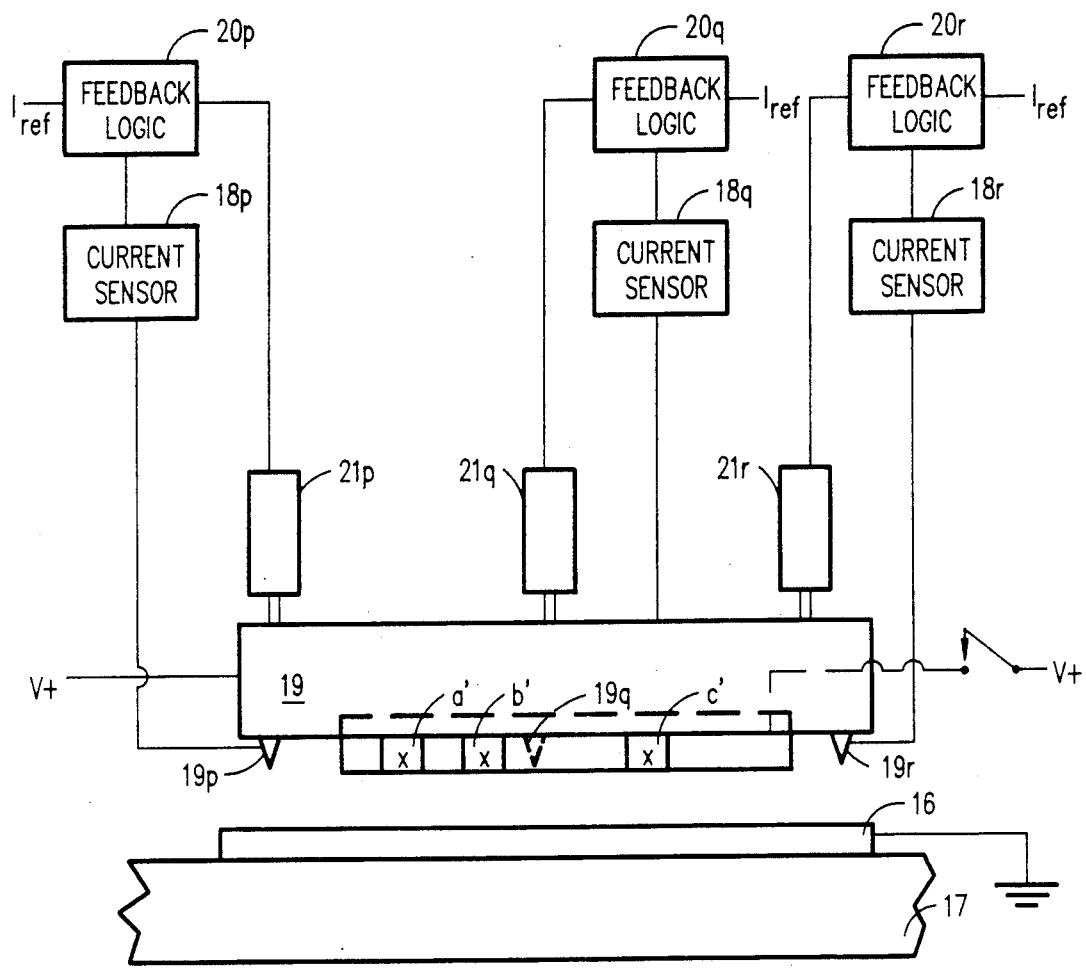
FIG. 2A is a side elevational view of apparatus, including the mask of FIG. 1C, for replicating on another film in a single step a pattern corresponding to said desired pattern.
Figure 2B:
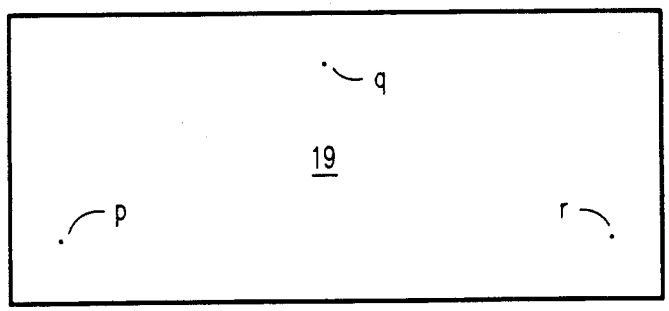
FIG. 2B is a bottom plan view of the mask of FIG. 2A.

As illustrated in FIG. 2A, film 16 is placed on a conductive substrate 17, such as of Si. Mask 15 is supported in a mast holder 19 and positioned about 20-100 angstroms above film 16 with the pattern-defining crystalline areas (such as a',b',c') facing said film.

Outside the boundaries of mask 15 and electrically isolated therefrom, mask holder 19 has a special conductive pattern (FIG. 2A). Three current sensing devices 18p, q and r are electrically connected to respective STM-type tips 19p, q, r on mask holder 19 to sense the interatomic tunneling currents between the mask holder and film 16 independently at three widely spaced points p,q,r, respectively. These tips may be mounted on adjustable cantilevers (not shown) attached to holder 19 to facilitate accurate alignment between the mask and holder. Or, alternatively, the mask itself could have the tips formed thereon.

Device 18p transmits the tunneling current as sensed at tip 19p to suitable feedback logic 20p. Logic 20p compares the sensed current with a reference current $I_{ref}$ and provides a correction signal to a coarse/fine z-drive controller 21p when the sensed and reference currents differ. Controller 21p may, for example, be the Nanoscope marketed by Digital Instruments of Santa Barbara, Calif. which comprises a stepper motor and a piezoelectric element for coarse and fine motion adjustments, respectively, in the z direction. Similar feedback logic 20q, r and controllers 21q, r are associated with sensing devices 18q, r, respectively, and operate similarly.

In this manner, the current is sensed by tip 19 at each point p,q,r and the associated feedback logic 20 and controllers 21 operate to maintain the tunneling current and hence the distance between the respective tip and surface of film 16 constant.

According to a feature of the invention, the independent current and hence distance adjustment at the three widely spaced points p,q,r desirably permits adjustment for tilt. The sensing, feedback and controller apparatus can also desirably be used to initially bring, as well as to later maintain, the mask 15 within the previously stated 20-100 angstroms distance from film 16.

With mask 15 maintained within the 100 angstroms from film 16, a voltage pulse is now applied between the mask and film. This will cause the current to flow in the crystalline areas of the mask, and electrons will tunnel and/or field emit from the negative to the positive conductor. The magnitude and duration of the voltage pulse is sufficient to change the properties, such as chemical bonding, in the patterned areas of film 16 if said film is a resist.

If the film 16 is of phase-changeable material, as herein illustrated, current flow is preferably such that the "exposed" areas (i.e., areas opposite the conductive pattern in the mask) of the unpatterned film are transformed from one state to the other. After "exposure", the amorphous material can be removed to leave the crystalline areas or, if preferred, the crystalline material can be removed by electrochemical etching to provide the replicated pattern in the wafer.

The materials for the mask film 10 and film 16 preferably should be different so that the conditions to cause changes in crystallinity will be different. For example, if the mask film 10 is of GeTe, the film 16 could be of InSb.

According to an important feature of the invention, the change from crystalline to amorphous in film 16 during current flow will reduce the current in the locally changed area due to the difference in electrical conductivity between amorphous and crystalline material. This self-limiting process will automatically limit the current to areas within the pattern which initially draw more current, thereby eliminating the risk of undesired broadening of film 16.

According to another important feature of the invention, mask 15 is made positive and film 16 negative so that electrons desirably will flow from film 16 to mask 15, thereby providing enhanced resolution by eliminating the backscattering which occurs in E-beam lithography techniques heretofore proposed, wherein electrons must flow to the film.

If preferred, film 16 may be covered with a thin layer of electron resist. Then the mask 15 is brought to and maintained within the 20-100 angstroms distance, as above explained, and a voltage is applied between the film and mask with the mask positive. The voltage is of such magnitude and duration as to cause the resultant current flow to replicate the pattern in the resist. The resist is then used to pattern the film by conventional methods, such as etching, liftoff, etc.

Also, if preferred, the amorphous areas may be stripped away, such as by electrochemical etching in a dilute (e.g., 10%) solution of KOH. This would leave a three-dimensional mask wherein only the crystalline conducting areas a',b',c' would remain on the substrate 11 to define the desired mask pattern.

It will also be understood that, if preferred, the current sensors 18p, q, r may be replaced by capacitive sensors to sense the capacitance between tips 19p, q, r and the film 16; and the feedback logic 20p, q, r would then be altered to accept a capacitive voltage reference rather than $I_{ref}$.

The preceding description, for sake of simplified illustration, has assumed that the film to be patterned is initially flat, like film 10. If this is not the case and the film already has had some processing steps applied and has attained a certain topography, then the mask should be made with mirror image topography so that it fits onto the film with precision. Such an intricate three-dimensional mask would be created by multiple steps of creating conducting crystalline regions using the STM, stripping away unwanted amorphous regions, applying a thin film of amorphous GeTe, creating conducting regions, and so on. If the topography of the film to be patterned becomes excessive, planarizing techniques can be used. Ultra flat surfaces over large areas have been achieved and reported in SPIE, 680, pp. 141-149 (1987).

It has also been assumed that mask 15 will be used to pattern a film on the ultimate device, such as a semiconductor wafer. However, it will be understood that, if preferred, mask 15 can be used as a master to pattern intermediate masks from which the ultimate device is patterned, in order to increase the useful life of the mask 15.

While the invention has been shown and described with reference to a preferred embodiment thereof, it will be understood by those skilled in the art that the foregoing and other changes in form and detail in the method and apparatus for creating the mask and using it may be made without departure from the scope and teaching of the invention. Accordingly, the apparatus and method herein disclosed are to be considered merely as illustrative, and the invention is to be limited only as specified in the claims.

We claim:

1. A method of generating a high resolution lithographic mask comprising the steps of:
    moving the tunneling tip of a scanning tunneling microscope in a z direction to within electron tunneling distance from a film having a region normally of one conductivity;
    applying voltage pulses to said tip in a preselected sequence while concurrently effecting relative movement between the tip and film in preselected x and y directions, said pulses being of sufficient magnitude and duration to change the conductivity of the material in selected areas of said region to another conductivity to provide from the film a mask having a desired pattern defined by areas of different conductivity and capable of being replicated without removing material of one of said conductivities from the film.

2. The method of claim 1, including the further steps of:
    placing on a conductive substrate another film on which a mirror image of the pattern is to be replicated;
    disposing the mask with its patterned side within electron tunneling distance of said other film; and
    replicating the pattern on said other film in a single step by applying a voltage between said mask and other film.

3. The method of claim 2, wherein the mask is an anode and said other film is a cathode to cause electrons to travel toward said mask and prevent backscattering on said other film.

4. The method of claim 2, including the steps of:
    sensing, at each of a plurality of spaced points defined by a plurality of tunneling tips on a holder for the mask or on the mask itself, the tunneling or field emission current between a respective one of said tips and said other film;
    comparing the sensed current with a reference current; and
    maintaining each of the last-mentioned tips and said other film apart a predetermined distance corresponding to the preselected value of the reference current for thereby enabling the mask to tilt as necessary to maintain said predetermined distance at each such point.

5. A method of generating a high resolution lithographic mask comprising the steps of:
    providing on a conducting substrate a film of phase-changeable material having a region uniformly in a first phase state;
    moving the tunneling tip of a scanning tunneling microscope in a z direction to within electron tunneling distance from said region;
    applying voltage pulses to said tip in a preselected sequence while concurrently effecting relative movement between the tip and film in preselected x and y directions, said pulses being of sufficient magnitude and duration to change the state and thereby the conductivity of the material in selected areas of said region to a second state to provide from the film a mask having a desired pattern.

6. The method of claim 5, wherein the states are crystalline and amorphous, and the material is one having a conductivity orders of magnitude higher in its crystalline state than in its amorphous state.

7. The method of claim 5, wherein said first state is amorphous and the second state is crystalline.

8. The method of claim 7, including the further step, following the applying step, of removing the amorphous material so that the pattern will be defined solely by crystalline state material projecting from the surface of the substrate.

9. The method of claim 5, including the further steps of:

placing on the film another film with a resist on which a mirror image of the pattern is to be replicated;

disposing the mask with its patterned side within electron tunneling distance of said other film; and replicating the pattern in said other film in a single step by applying a voltage between said mask and other film of sufficient magnitude and duration to produce a current that changes the state of the material in said other film in the pattern-defining areas.

10. The method of claim 9, wherein the voltage charge on said mask is positive and negative on said other film to cause electrons to flow from said other film to said mask.

11. The method of claim 9, including the further step of:

voltage biasing said mask and other film to cause electrons to pass from said other film to the crystallized areas of said mask and heat said areas to a degree sufficient to change said other film from the crystalline to the amorphous state in said areas.

12. The method of claim 9, wherein during the replicating step, the state is changed from crystalline to amorphous, and as the state changes and conductivity progressively decreases, current flow in the crystalline area will correspondingly reduce and minimize the risk of undesired broadening of said other film.

13. The method of claim 9, including the further step, after the replicating step, of using said other film as an intermediate mask from which the desired pattern may be replicated onto still other films.

14. The method of claim 2, including the steps of:

sensing, at each of a plurality of spaced points defined by tunneling tips on a holder for the mask, an electrical condition between a respective one of said tips and said other film;

comparing the condition as sensed with a preselected reference condition; and maintaining each of said tips on the mask holder and said other film apart a predetermined distance corresponding to the preselected value of the reference condition for thereby enabling the holder and thereby the mask to tilt as necessary to maintain said predetermined distance at each such point.

* * * * *